United States Patent
Wang et al.

(10) Patent No.: US 7,649,405 B2
(45) Date of Patent: Jan. 19, 2010

(54) LEAKAGE CURRENT CONTROL CIRCUIT WITH A SINGLE LOW VOLTAGE POWER SUPPLY AND METHOD THEREOF

(75) Inventors: Jinn-Shyan Wang, Hsinchu (TW); Hung-Yu Li, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/415,210

(22) Filed: May 2, 2006

(65) Prior Publication Data
US 2007/0030057 A1 Feb. 8, 2007

(30) Foreign Application Priority Data
Aug. 8, 2005 (TW) .............................. 94126871 A

(51) Int. Cl.
G05F 1/10 (2006.01)
G05F 3/02 (2006.01)
(52) U.S. Cl. ................ 327/544; 327/546; 365/227; 326/34
(58) Field of Classification Search ................ 327/530, 327/534, 535, 537, 544–546; 326/33, 34; 365/226–229
See application file for complete search history.

(56) References Cited

U.S. PATENT DOCUMENTS

| | | | | |
|---|---|---|---|---|
| 5,821,769 A | * | 10/1998 | Douseki | 326/34 |
| 6,118,328 A | * | 9/2000 | Morikawa | 327/534 |
| 6,166,985 A | * | 12/2000 | McDaniel et al. | 365/230.06 |
| 6,384,674 B2 | * | 5/2002 | Tanizaki et al. | 327/544 |
| 6,946,869 B2 | * | 9/2005 | Jacobson et al. | 326/33 |
| 6,946,901 B2 | * | 9/2005 | Kang et al. | 327/544 |
| 6,977,519 B2 | * | 12/2005 | Bhavnagarwala et al. | 326/34 |
| 7,080,270 B2 | * | 7/2006 | Yokozeki et al. | 713/320 |
| 7,224,197 B2 | * | 5/2007 | Wang et al. | 327/202 |
| 7,375,547 B2 | * | 5/2008 | Shimura | 326/33 |

OTHER PUBLICATIONS

"Design Techniques for Single-Low-$V_{DD}$ CMOS Systems". Jinn-Shyan Wang et al. IEEE Journal of Solid-State Circuits, vol. 40, No. 5, May 2005.
Taiwan Office Action dated Jan. 14, 2009 for corresponding Taiwan Application No. 094126871.

* cited by examiner

*Primary Examiner*—Lincoln Donovan
*Assistant Examiner*—Patrick O'Neill
(74) *Attorney, Agent, or Firm*—Harness, Dickey & Pierce, P.L.C.

(57) ABSTRACT

A leakage current control circuit with a single low voltage power supply is provided. The circuit includes a first power supply line, a second power supply line, a ground line, a high voltage generating circuit, a power transistor and a control circuit. The high voltage generating circuit generates a voltage in response to an internal sleep signal. The gate electrode of the power transistor is connected to the output of the high-voltage generating circuit such that the power transistor is controlled by the high voltage generating circuit. When the power transistor turns on, the circuit is in operation mode; when the power transistor is off, the circuit is in sleep mode. The control circuit connects to the first power line, the second power line, and the ground line to output the internal sleep signal in response to the sleep signal.

27 Claims, 5 Drawing Sheets

LEAKAGE CURRENT CONTROL CIRCUIT WITH A SINGLE LOW VOLTAGE POWER SUPPLY AND METHOD THEREOF

This Non-provisional application claims priority under 35 U.S.C. § 119(a) on Patent Application No(s). 094126871 filed in Taiwan, R.O.C. on Aug. 8, 2005, the entire contents of which are hereby incorporated by reference.

BACKGROUND OF THE INVENTION

1. Field of Invention

The present invention relates a CMOS circuit, more specifically, a CMOS leakage current control circuit with a single low-voltage power supply.

2. Related Art

The control of leakage current is very important in the design of IC (Integrated Circuit), especially in the design of low-power and low-voltage IC.

FIG. 1 illustrates a prior art leakage current control circuit, namely, a super cut-off CMOS (SCCMOS), having an active mode and a sleep mode. The active mode means that the core circuit is in an operating state. After receiving an external sleep mode control signal (SLP), the core circuit will stop operation and shift into an idle status (i.e., a sleep mode) to lower power consumption. As shown in the drawing, the prior art leakage current control circuit includes a high-voltage generating circuit 102, a switch circuit, for example a power transistor, 104, a sleep-control circuit 106, a plurality of flip-flops 110, 113 and 116, and a plurality of combinational circuits 112 and 115. Each of the flip-flops 110, 113 and 116 has a corresponding memory device 111, 114 and 117, respectively, which back up the data in the flip-flops 110, 113 and 116 when the circuit is in a sleep mode. The operation of the control circuit will be detailed below.

A first end of the transistor 104 is connected to a first power supply line VDD, and a second end of the transistor is connected to a second power supply line VDDV, and the gate electrode of the transistor 104 is connected to the output of the high-voltage generating circuit 102. In response to an internal sleep signal (SLPI), the high-voltage generating circuit 102 generates and supplies a high-voltage VGP higher than the supply voltage VDD to the gate electrode of the transistor 104. This is called the super cutoff mechanism. The flip-flops 110, 113, and 116 are connected between the second power supply line VDDV and the first ground line GND. The memory devices 111, 114 and 117 are connected between the first power supply line VDD and the second ground line VSS. The combinational circuits 112 and 115 are connected between the second power supply line VDDV and the first ground line GND. The control circuit 106 is connected to the first power supply line VDD and the second power supply line VDDV. After the control circuit 106 receives an external sleep mode control signal SLP, it outputs a corresponding internal sleep mode signal SLPI. It also outputs an internal clock signal CK to the flip-flops 110, 113 and 116 in response to an external clock signal CKE. Meanwhile, the wordline signal WL controls the operation of the memory device 111, 114, and 117.

The circuit shown in the FIG. 1 applies the super cutoff mechanism to the power transistor 104 to limit the leakage current in the sleep mode to an average of pico-ampere each gate. By applying the super cutoff scheme, the supply voltage VDD can also be reduced to a very low voltage, say 0.5V. However, because each of the flip-flops has an extra memory device for data backup in the sleep mode, and because the memory devices are high threshold-voltage elements that cannot operate under low-voltage, an extra voltage of −0.5V (VSS) besides a power supply of 0.5V (VDD) has to be provided to activate the memory devices. Further, the wakeup time of the entire circuit from the sleep mode to the active mode is long.

In order to solve the problems described above, the prior art provides another circuit, as shown in FIG. 2, an zigzag super cut-off CMOS (ZSCCMOS), including a high-voltage generating circuit 201, a low-voltage generating circuit 202, a first switch circuit, for example a P-channel power transistor, 203, a second switch circuit, for example an N-channel power transistor, 204, a control circuit 206, a plurality of flip-flops 210 and 218, and a plurality of combinational circuits 212, 214, and 216. The flip-flops 210 and 218 have different properties. The operation of the circuit is detailed below.

A first end of the first P-channel power transistor 203 is connected to a first power supply line VDD, a second end of the power transistor 203 is connected to a second power supply line VDDV, and the gate electrode of the power transistor 203 receives the output of a high-voltage generating circuit 201. A first end of the second N-channel power transistor 204 is connected to the first ground line GND, a second end of the power transistor 204 is connected to a second ground line GNDV, and the gate electrode of the power transistor 204 receives the output of a low-voltage generating circuit 202. In response to an internal sleep mode signal SLPI, the high-voltage generating circuit 201 generates an output voltage VGP higher than the power supply voltage VDD and supplies the output voltage VGP to the gate electrode of the first transistor 203. In response to an internal sleep mode signal SLPI#, the low-voltage generating circuit 202 generates an output voltage VGN lower than the voltage GND and supplies the sleep signal SLPI# to the gate electrode of the second transistor 204. The flip-flops 210 and 218 must be connected to VDD, VDDV, VGP, GND, GNDV, and VGN. The combinational circuits 212 and 216 are connected between the second power supply line VDDV and the first ground line GND. The combinational circuit 214 is connected between the first power supply line VDD and the second ground line GNDV. The control circuit 206 generates internal sleep mode signals SPLI and SLPI# in response to an external sleep mode signal SLP. It also outputs an internal clock signal CK in response to an external clock signal CKE to the flip-flops 210 and 218. In the sleep mode, the input of the combinational circuit 212 is maintained at a high level and the output of the combinational circuit 212 is maintained at a low level, the input of the combinational circuit 214 is maintained at a low level and the output of the combinational circuit 214 is maintained at a high level, the input of the combinational circuit 216 is maintained at a high level and the output of the combinational 216 is maintained at a low level.

The circuit shown in FIG. 2 may reduce the wakeup time. However, because each pipeline stage needs a special flip-flop (flip-flop 210) as an input phase-locking circuit and an ordinary flip-flop (flip-flop 218) as an output terminal to save data when in the sleep mode, each pipeline stage of the circuit includes two kinds of flip-flops. This means the circuit may not be used in a typical consecutive pipeline system or the circuit shown in FIG. 2 can only be used at a specific pipeline stage. Although ZSCCMOS is single low-voltage circuit, its flip-flops use more wires to control the operation in the sleep mode. Therefore, more wire resources are needed.

SUMMARY OF THE INVENTION

Exemplary embodiments of the present invention provide a single low-voltage CMOS circuit to solve the problems described above.

A single low-voltage power supply CMOS circuit according to an exemplary embodiment of the present invention includes a first power supply line, a second power supply line, a first ground line, a high-voltage generating circuit, a switch circuit, for example a power transistor, and a control circuit, wherein the high-voltage generating circuit generates an output voltage in response to an internal sleep signal. The switch circuit includes a first end, a second end and a gate electrode, wherein the first end is connected to the first power supply line, the gate electrode to the output of the high-voltage generating circuit, and the second end is connected the second power supply line. The circuit enters into an active mode when the power transistor is turned on and enters into a sleep mode when the power transistor is turned off. The control circuit is connected to the first power supply line and the second power supply line, and generates an internal sleep mode signal in response to an external sleep mode signal. The control circuit also controls a clock signal.

According to an exemplary embodiment of the present invention, flip-flops only need a low-voltage power supply, and the low-voltage power supply will not be turned off in the sleep mode. In the prior art, flip-flops need two power supply lines and part of the power supply will be turned off in the sleep mode.

According to an exemplary embodiment of the present invention, in the sleep mode, a clock signal is strengthened and maintained at a voltage higher than the power supply voltage VDD, to thereby prevent possible leakage current. Such a design does not need sleep mode signal line in the combination circuits and flip-flops, to thereby save wire resource and reduce the stray-capacitance.

The prior art ZSCCMOS needs two types of flip-flops to realize the fast wakeup mechanism. However, this type of design cannot be used in consecutive pipeline stages. The exemplary embodiment of the present invention uses only one type of flip-flop and therefore may be used anywhere in the system; moreover, the pipeline stages may be cascaded in series as usual.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below illustration only, and thus are not limitative of the present invention, and wherein.

DETAILED DESCRIPTION OF THE INVENTION

The present invention will be described in details in combination with the embodiments in order for further understanding to the objects, structures, features and functions of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
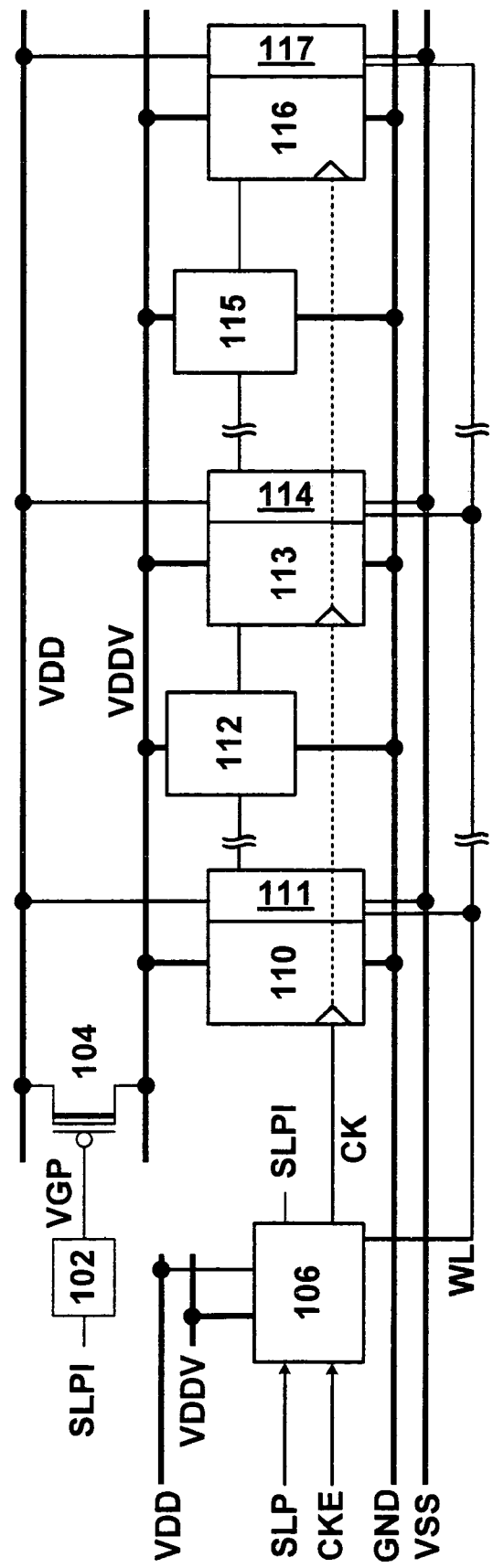
FIG. 1 illustrates a prior art leakage current control circuit.
Figure 2:
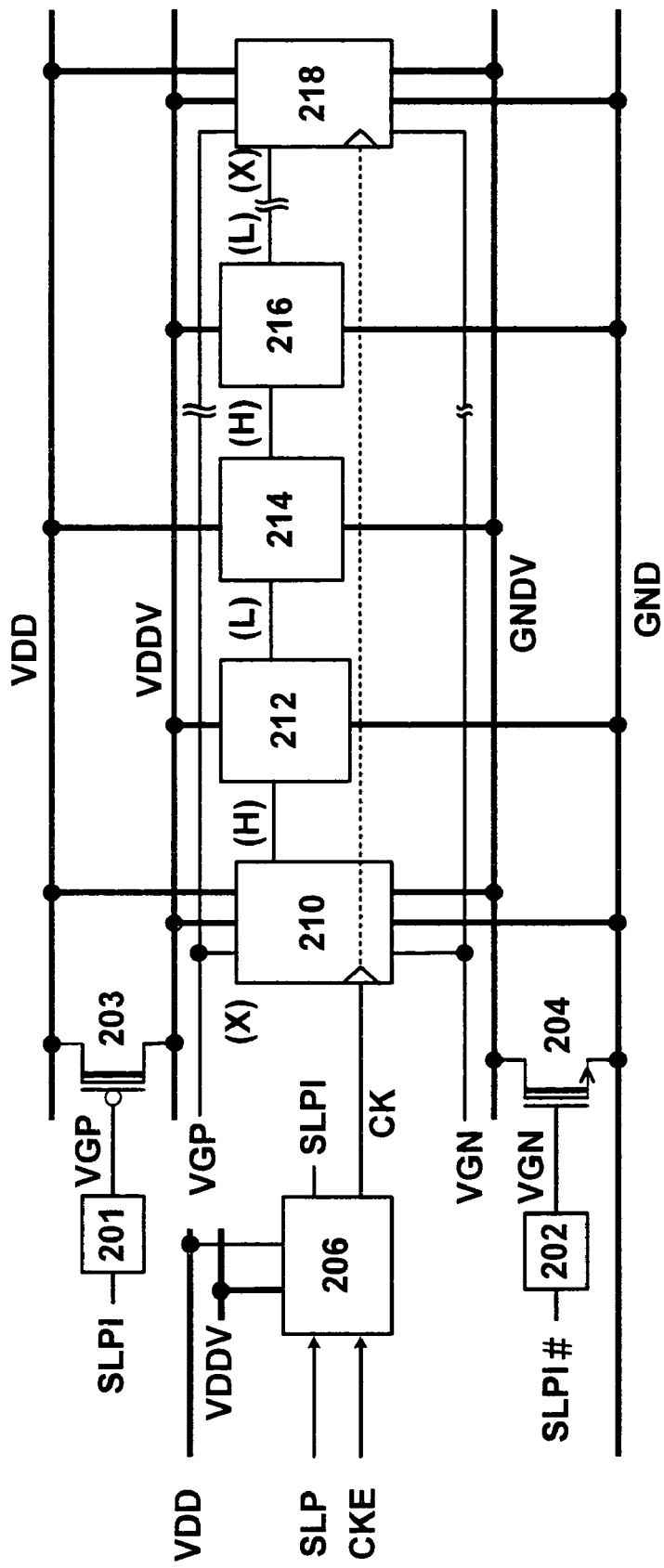
FIG. 2 illustrates another prior art leakage current control circuit.
Figure 3:
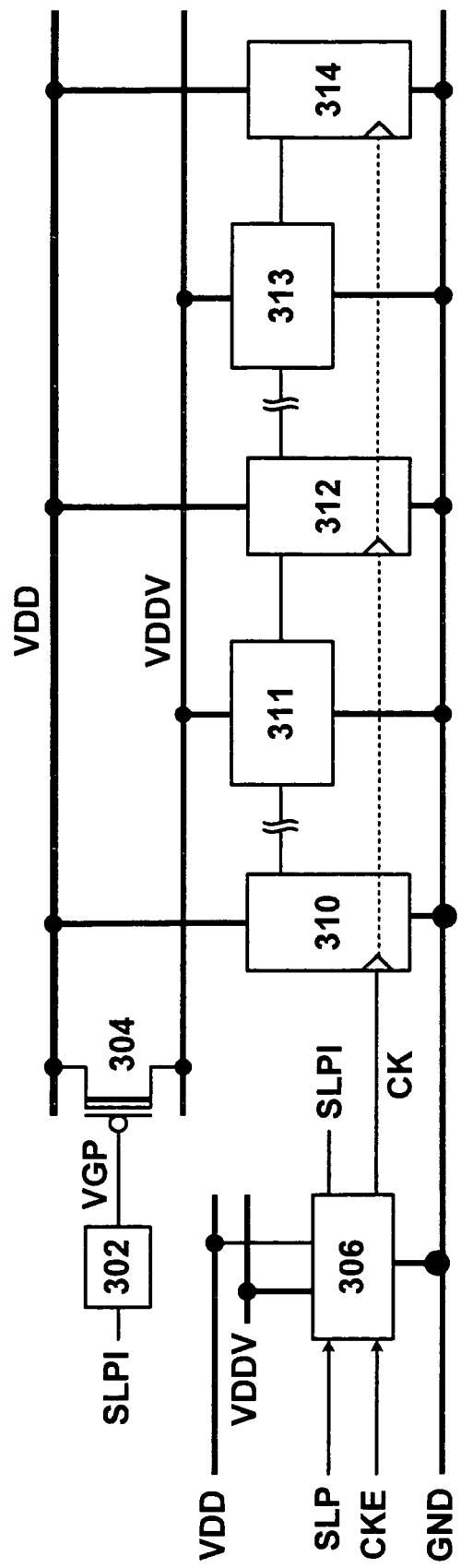
FIG. 3 illustrates a leakage current control circuit according to an exemplary embodiment of the present invention.

FIG. 3 illustrates a leakage current control circuit according to an exemplary embodiment of the present invention. The circuit is a single low-voltage power supply circuit (SLVC-MOS). Compared with the prior art, the leakage control circuit realizes a single power supply design to thereby simplify the design of a system.

As shown in the drawing, the leakage current control circuit includes a high-voltage generating circuit 302, a switch circuit, for example a power transistor, 304, a control circuit 306, a plurality of flip-flops 310, 312, and 314, and a plurality of combinational circuits 311 and 313. In this exemplary embodiment, the number of flip-flops is for illustration only and is not meant to limit the present invention. In practical use, the number of flip-flops may be changed if necessary. The operation of the circuit is detailed below.

The power transistor 304 is an element having three terminals. In order to operate at a low voltage, the power transistor and the combinational circuits use low-threshold voltage devices. In this exemplary embodiment, the power transistor 304 is a PMOS transistor. A first end of the power transistor 304 is connected to a first power supply line VDD, a second end of the power transistor 304 is connected to a second power supply line VDDV, and the gate electrode of the power transistor 304 receives the output from the high-voltage generating circuit 302. When the power transistor 304 is turned on, the power supply voltage is supplied to a core circuit (e.g., the control circuit 306, the flip-flops 310, 312 and 314, and the combinational circuits 311 and 313) to perform active operations,. When the power transistor 304 is turned off, the power supply voltage is not supplied to the core circuit to reduce power consumption. Meanwhile, in order to reduce leakage current, the high-voltage generating circuit 302 generates an output voltage VGP higher than the power supply voltage VDD in response to an internal sleep mode signal SLPI, and supplies the output voltage VGP to the gate electrode of the switch circuit 304, to thereby turn off the switch circuit to the extent possible and limit leakage current to an average of pico-ampere at each gate.

Figure 5:
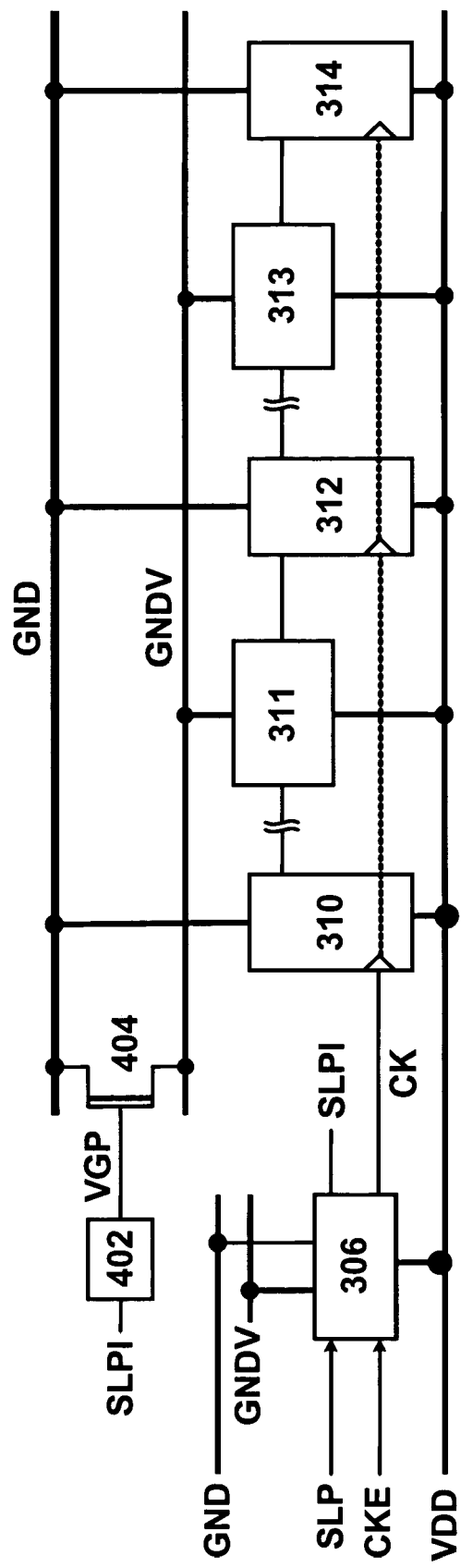
FIG. 5 illustrates a leakage current control circuit according to another exemplary embodiment of the present invention.

A similar circuit structure that uses a NMOS power transistor 404 can be used instead, where a low voltage generating circuit 402, a first power supply VDD, a first ground line GND, and a second ground line GNDV are needed, as shown in FIG. 5. The NMOS power transistor is connected between GND and GNDV, and its gate electrode is connected to the output of the low voltage generating circuit.

In another exemplary embodiment, a high-voltage generating circuit 302 including a charge pump may be used to generate an output voltage VGP higher than the power supply voltage VDD. Since how to use a charge pump and related circuits to generate an output voltage is familiar to persons having ordinary skills in the art, it will not be described herein.

The flip-flops 310, 312, and 314 have similar characteristics and are connected between a first power supply line VDD and a first ground line GND. The combinational circuits 311 and 313 are connected between a second power supply line VDDV and a first ground line GND. The combinational circuits 311 and 313 are comprised of low-threshold voltage CMOS transistors.

The flip-flops 310, 312 and 314 use high and low threshold voltage devices, and the leakage current of flip-flops could be effectively controlled in the sleep mode. Thus the flip-flops without memory devices may be connected directly to the power supply voltage VDD without the need for an extra low-leakage current power transistor. Because the flip-flops are connected directly to the power supply VDD without having to pass through a power transistor, the exemplary embodiment of the present invention has a higher operation speed compared with other types of prior circuits. The combinational circuits 311 and 313 do not need to share current with the flip-flops, and can therefore get more operating current and an improved speed.

The control circuit 306 controls clock signals and the operation of the sleep mode. The control circuit 306 is connected to the first power supply line VDD and the second power supply line VDDV. The control circuit 306 outputs an internal sleep mode signal SLPI in response to an external sleep mode signal SLP. It also outputs an internal clock signal CK to flip-flops 310, 312, and 314 in response to an external clock signal CKE. When the sleep signal SLP becomes 0, the internal sleep mode signal SLPI turns 0, and the output voltage VGP is increased to VDD+VSLP. The internal clock signal stops and will be pulled to a voltage level higher than VDD. Therefore, the flip-flops 310, 312 and 314 stop operation and only save the data generated before the circuit shift to the sleep mode.

Figure 4:
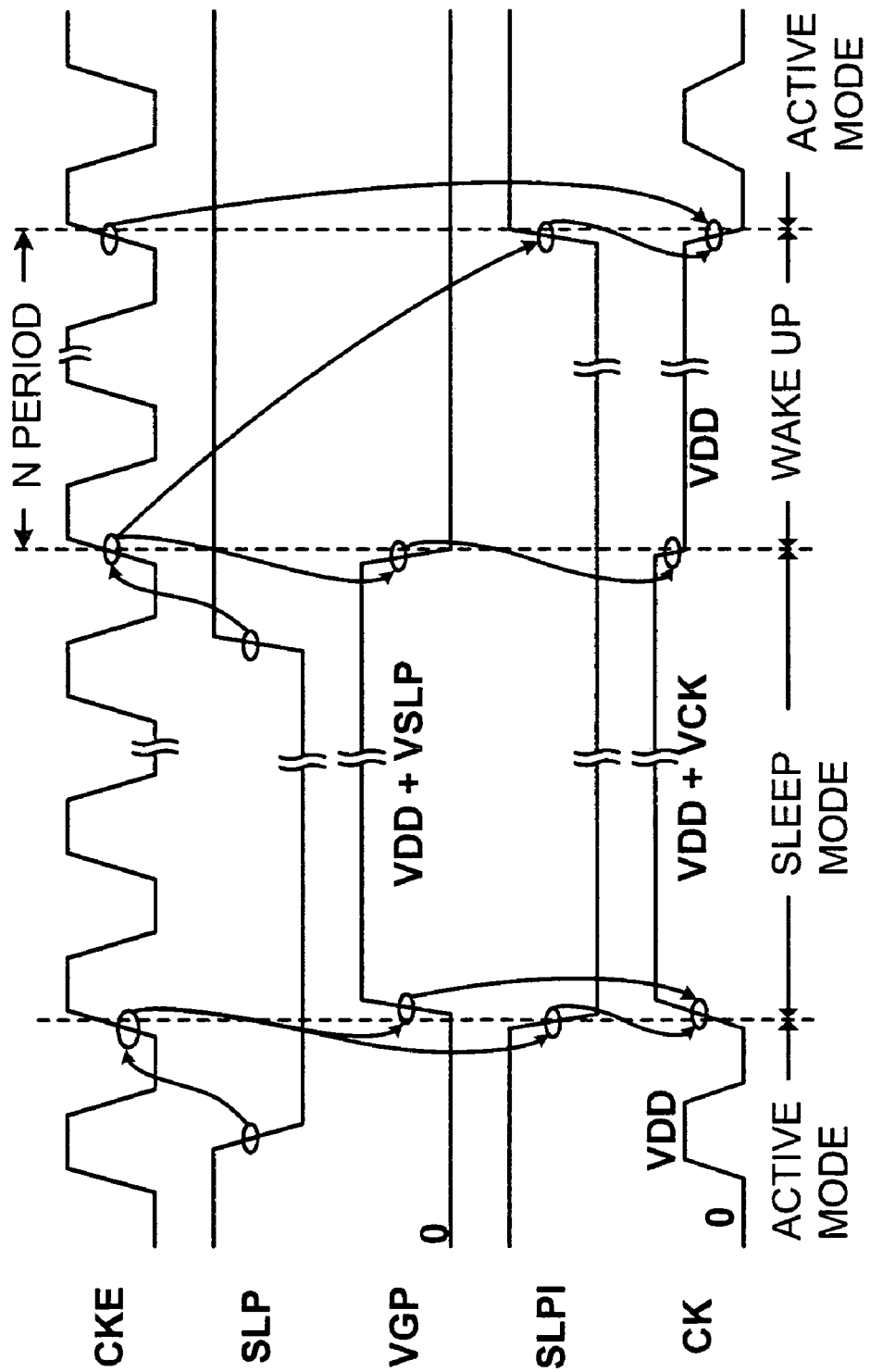
FIG. 4 is a flow chart of the operation of a leakage current control circuit according to an exemplary embodiment of the present invention.

FIG. 4 is a flow chart of the operation of a leakage current control circuit according to an exemplary embodiment of the present invention.

The external clock signal is applied to the circuit as the clock signal for the circuit and as a basis for synchronization. As shown in FIG. 3, an exemplary embodiment of the present invention uses a PMOS power transistor as a switch circuit, therefore the internal sleep mode signal SLPI is active low.

When the circuit is in the active mode, the sleep mode signal SLP is at a high level. Meanwhile, the output voltage VGP of the high-voltage generating circuit 302 is at a low level, and the internal clock signal CK oscillates between the power supply voltage VDD and the zero voltage.

When the control circuit 306 receives the sleep mode signal SLP, it synchronizes the sleep mode signal SLP with the external clock signal CKE, outputs the internal sleep mode signal SLPI to the high-voltage generating circuit 302, outputs the voltage VGP higher than the power supply voltage VDD to the switch circuit 304, and thus enters into the sleep mode. The control circuit 306 controls the internal sleep mode signal SLPI to synchronize it with the external clock signal CKE when it enters into the sleep mode or get out of sleep mode.

The output voltage VGP is VDD+VSLP, wherein the voltage VSLP is about 0.2V to 0.4V. When the voltage VSLP is higher than 0.2V, the decrease of leakage current is realized. When in the sleep mode, the voltage of CK is increased to VDD+VCK V. In an exemplary embodiment, VCK is about 0.2V. The output voltage VGP is VDD+VSLP and is higher than the power supply voltage VDD, which may put the voltage Vgs of the power transistor into a reverse bias status to thereby prevent the occurrence of the leakage current.

When the sleep mode signal SLP turns to a high level, the circuit enters into an active mode. After synchronized by the control circuit 306, the output voltage VGP is in synchronization with the clock signal CK, and the output voltage VGP turns to a low level. The clock signal CK maintains the power supply voltage VDD without oscillating for a while to provide a current charging the circuit, that is, the second power supply line VDDV will be charged to the power supply voltage VDD. Meanwhile, the internal sleep mode signal SLPI is still maintained at a low level. After N cycles of charging, the clock signal CK begins to oscillate, and the internal sleep mode signal SLPI turns to a high level. The circuit thus enters into the active mode.

Because the adoption of a low-threshold voltage power transistor and the use of a single power supply, exemplary embodiments of the present invention may lower the working voltage to 0.5V. Even if some high-threshold voltage (e.g., 0.3V and 0.5V) transistors are used, those transistors can still work normally at a power supply voltage of 0.5V. The circuit according to exemplary embodiments of the present invention is characterized by short wakeup time and low power consumption.

In the active mode, the circuit according to exemplary embodiments of the present invention may limit the leakage current to pico-ampere at each logic gate, to thereby improve power efficiency and lower power consumption. The power supply of the flip-flops is connected to the power supply line directly, and an extra power transistor is not needed. Therefore, when the flip-flops are in the sleep mode or are activated, there is no need to backup or retrieve the data. Because the power of the flip-flops is never turned off, the power needed to activate the flip-flops is low. The flip-flops do not need any sleep mode signals, therefore less wire is needed and a high operating speed may be achieved with low power consumption. In the sleep mode, the flip-flops can prevent the occurrence of large leakage current.

The circuit according to exemplary embodiments of the present invention may have reduced wakeup time and need less wakeup power. Further, it can be used at a pipeline system without any limitation. The circuit according to exemplary embodiments of the present invention does not need control wire in the sleep mode, and can thereby save routing resource.

Moreover, the circuit according to exemplary embodiments of the present invention may be fabricated through the ordinary bulk-CMOS process or the SOI process.

The leakage current control circuit can be applied to a pipeline system, comprising combinational circuits and flip-flops. The combinational circuits are connected between the second power line and the ground line, and the flip-flops triggered by the clock signal are connected between the first power supply line and the ground line. The clock signal, which is controlled by the control circuit, runs between the supply voltage and ground voltage in the operation mode and is raised to a voltage above the supply voltage.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A leakage current control circuit with a single low voltage power supply, operating in a sleep mode or an active mode in response to an internal sleep mode signal, comprising:
   a first power supply line connected to a plurality of first components, the plurality of first components including one of a plurality of flip-flops and a plurality of combinational circuits;
   a second power supply line connected to a plurality of second components, the plurality of second components including an other of the plurality of flip-flops and the plurality of combinational circuits, each of the plurality of first components and the plurality of second components being connected to different ones of the first and second power supply lines, respectively;
   a first ground line;
   a high-voltage generating circuit for generating an output voltage in response to the internal sleep mode signal;
   a power transistor having a first end, a second end and a gate electrode, wherein the first end is connected to the said first power supply line, the second end is connected to the second power supply line, the gate electrode is connected to the output of the said high-voltage generating circuit; and
   a control circuit connected to the first power supply line, the second power supply line, and the first ground line for generating the internal sleep mode signal in response to an external sleep mode signal and controlling a clock signal.

2. The leakage current control circuit with a single low voltage power supply of claim 1, wherein the leakage current control circuit enters into an active mode when the power transistor is turned on and enters into the sleep mode when the power transistor is turned off.

3. The leakage current control circuit with a single low voltage power supply of claim 1, wherein the power transistor has a low threshold voltage.

4. The leakage current control circuit with a single low voltage of claim 3, wherein the power transistor is a PMOS.

5. The leakage current control circuit with a single low voltage of claim 1, wherein the internal sleep signal controls the high-voltage generating circuit to turn on or off.

6. The leakage current control circuit with a single low voltage of claim 1, wherein the output of the high-voltage generating circuit is at a low level in the active mode and will be increased by a predetermined value in the sleep mode.

7. The leakage current control circuit with a single low voltage of claim 6, wherein the predetermined value is above the voltage of the said first power supply line.

8. The leakage current control circuit with a single low voltage of claim 1, wherein the control circuit controls the internal sleep mode signal and synchronizes the internal sleep mode signal with the external clock signal when entering into or getting out of the sleep mode.

9. The leakage current control circuit with a single low voltage of claim 1, wherein the internal sleep mode signal is activated after N clock cycles.

10. A leakage current control circuit with a single low voltage power supply, operating in a sleep mode or an active mode in response to an internal sleep mode signal, comprising:
    a first power supply line connected to a plurality of first components, the plurality of first components including one of a plurality of flip-flops and a plurality of combinational circuits;
    a second power supply line connected to a plurality of second components, the plurality of second components including an other of the plurality of flip-flops and the plurality of combinational circuits, each of the plurality of first components and the plurality of second components being connected to different ones of the first and second power supply lines, respectively;
    a first ground line;
    a high-voltage generating circuit for generating an output voltage in response to the internal sleep mode signal;
    a power transistor having a first end, a second end and a gate electrode, wherein the first end is connected to the said first power supply line, the second end is connected to the second power supply line, the gate electrode is connected to the output of the said high-voltage generating circuit; and
    a control circuit connected to the first power supply line, the second power supply line, and the first ground line for generating the internal sleep mode signal in response to an external sleep mode signal and controlling a clock signal, wherein
       a clock signal oscillates between 0 voltage and power supply voltage in the active mode, and the output voltage of the high-voltage generating circuit is raised to a fixed voltage with a predetermined value in the sleep mode.

11. The leakage current control circuit with a single low voltage of claim 10, wherein the predetermined value is above the voltage of the first power supply line.

12. A leakage current control circuit with a single low voltage power supply, operating in a sleep mode or an active mode in response to an internal sleep mode signal, comprising:
    a first power supply line connected to a plurality of first components;
    a first ground line connected to a plurality of first components, the plurality of first components including one of a plurality of flip-flops and a plurality of combinational circuits;
    a second ground line connected to a plurality of second components, the plurality of second components including an other of the plurality of flip-flops and the plurality of combinational circuits, each of the plurality of first components and the plurality of second components being connected to only one of the respective first and second ground lines;
    a low-voltage generating circuit for generating an output voltage in response to the internal sleep mode signal;
    a power transistor having a first end, a second end and a gate electrode, wherein the first end is connected to the said first ground line, the second end is connected to the second ground line, the gate electrode is connected to the output of the said low-voltage generating circuit; and
    a control circuit connected to the first power supply line, the first ground line and the second ground line for generating the internal sleep mode signal in response to an external sleep mode signal and controlling a clock signal.

13. The leakage current control circuit with a single low voltage of claim 12, wherein the leakage current control circuit enters into an active mode when the power transistor is turned on and enters into the sleep mode when the power transistor is turned off.

14. The leakage current control circuit with a single low voltage power supply of claim 12, wherein the power transistor has a low threshold voltage.

15. The leakage current control circuit with a single low voltage of claim 12, wherein the power transistor is a NMOS.

16. The leakage current control circuit with a single low voltage of claim 12, wherein the internal sleep signal controls the low-voltage generating circuit to turn on or off.

17. The leakage current control circuit with a single low voltage of claim 12, wherein the output of the low-voltage generating circuit is at a high level in the active mode and will be decreased by a predetermined value in the sleep mode.

18. The leakage current control circuit with a single low voltage of claim 17, wherein the predetermined value is below the voltage of the said first ground line.

19. The leakage current control circuit with a single low voltage of claim 12, wherein the control circuit controls the internal sleep mode signal and synchronizes the internal sleep mode signal with the external clock signal when entering into or getting out of the sleep mode.

20. The leakage current control circuit with a single low voltage of claim 12, wherein the internal sleep mode signal is activated after N clock cycles.

21. A leakage current control circuit with a single low voltage power supply, operating in a sleep mode or an active mode in response to an internal sleep mode signal, comprising:
   a first power supply line connected to a plurality of first components;
   a first ground line connected to the plurality of first components, the plurality of first components including one of a plurality of flip-flops and a plurality of combinational circuits;
   a second ground line connected to a plurality of second components, the plurality of second components including an other of the plurality of flip-flops and the plurality of combinational circuits, each of the plurality of first components and the plurality of second components being connected to only one of the respective first and second ground lines;
   a low-voltage generating circuit for generating an output voltage in response to the internal sleep mode signal;
   a power transistor having a first end, a second end and a gate electrode, wherein the first end is connected to the said first ground line, the second end is connected to the second ground line, the gate electrode is connected to the output of the said low-voltage generating circuit; and
   a control circuit connected to the first power supply line, the first ground line and the second ground line for generating the internal sleep mode signal in response to an external sleep mode signal and controlling a clock signal, wherein
      a clock signal oscillates between 0 voltage and power supply voltage in the active mode, and the output voltage of the low-voltage generating circuit is lowered to a fixed voltage with a predetermined value in the sleep mode.

22. The leakage current control circuit with a single low voltage of claim 21, wherein the predetermined value is below the voltage of the first ground line.

23. A method for controlling a leakage current with a single low voltage power supply to respond to an internal sleep mode signal to make a circuit alternate between an active mode and a sleep mode, comprising:
   generating an output voltage higher than a power supply voltage in response to a sleep mode signal in the active mode, and outputting a clock signal in synchronization with the internal sleep mode signal to enter into the sleep mode; and
   generating an output voltage at 0 level in response to a sleep mode signal in the sleep mode, and outputting a voltage of 0V; wherein
      in at least the active mode, each of a plurality of first components and a plurality of second components are supplied with a power supply voltage via first and second power supply lines, each of the plurality of first components and the plurality of second components being connected to different ones of the first and second power supply lines, respectively,
      the plurality of first components including one of a plurality of flip-flops and a plurality of combinational circuits, and
      the plurality of second components including an other of the plurality of flip-flops and the plurality of combinational circuits.

24. The method for controlling a leakage current with a single low voltage power supply of claim 23, wherein the output voltage generated by a high-voltage generating circuit is at low level in the active mode, and will be increased by a predetermined value in the sleep mode.

25. The method for controlling a leakage current with a single low voltage power supply of claim 24, wherein the predetermined value is above the voltage of the first power supply line.

26. The method for controlling a leakage current with a single low voltage power supply of claim 23, wherein the clock signal oscillates between the 0V and the power supply voltage in the active mode, and the output voltage will be increased by a predetermined value in the sleep mode.

27. The method for controlling a leakage current with a single low voltage power supply of claim 26, wherein the predetermined value is above the voltage of the first power supply line.

* * * * *